United States Patent [19]

Fukuda

[11] Patent Number: 4,526,185
[45] Date of Patent: Jul. 2, 1985

[54] HOLDING APPARATUS FOR USE IN CLEANER OR DRYER FOR DUAL PIN TYPE ELECTRONIC PARTS

[75] Inventor: Yoshinori Fukuda, Osaka, Japan

[73] Assignee: Ideya Co., Ltd., Kyoto, Japan

[21] Appl. No.: 636,808

[22] Filed: Aug. 3, 1984

Related U.S. Application Data

[63] Continuation of Ser. No. 477,666, Mar. 22, 1983.

[30] Foreign Application Priority Data

Mar. 23, 1982 [JP]   Japan .................................. 57-46122

[51] Int. Cl.³ .............................................. B08B 3/04
[52] U.S. Cl. .................................... 134/159; 134/142
[58] Field of Search ..................... 134/159, 61, 66, 82, 134/142, 149

[56] References Cited

U.S. PATENT DOCUMENTS 2,972,997   2/1961   McCown et al. ................... 134/142

Primary Examiner—Stephen Marcus
Assistant Examiner—Renee S. Kidorf
Attorney, Agent, or Firm—Armstrong, Nikaido, Marmelstein & Kubovcik

[57] ABSTRACT

A holding apparatus for holding dual pin type electronic parts such as DIP type IC etc. when the electronic parts are cleaned or dried. The holding apparatus is used, for example, for cleaning or drying the dual pin type electronic parts automatically in line after the lead pins of the electronic parts are dipped by solder. The holding apparatus has at least one holding rod which holds the electronic parts on a mounting table in order to prevent the electronic parts from dropping off while the mounting table is rotated around a shaft, and the holding rod releases the electronic parts after the cleaning or drying thereof are completed.

4 Claims, 7 Drawing Figures

HOLDING APPARATUS FOR USE IN CLEANER OR DRYER FOR DUAL PIN TYPE ELECTRONIC PARTS

This application is a continuation of application Ser. No. 477,666, filed Mar. 22, 1983.

BACKGROUND OF THE INVENTION

1. Field of the Invention

This invention relates to a holding apparatus for use in a cleaner or dryer for dual pin type electronic parts, which apparatus can clean and/or dry automatically the electronic parts in line after the solder dipping of lead pins of the electronic parts is performed.

2. Prior Art

In a prior art, when the lead pins of the dual pin type electronic parts, for example, DIP (dual inline package) type IC (integrated circuit) etc. were dipped by solder, cleaned and dried, each treatment was made in each independent process. In such a prior art, however, it is difficult to obtain homogeneity of products and treat products in line.

Further, especially, in recent years, as it is required to mount electronic parts in very high density, it is necessary to perform the cleaning and drying treatment after the solder dipping in line and feed the electronic parts automatically. Therefore, it was desired to provide a cleaner and a dryer which can satisfy such demands.

SUMMARY OF THE INVENTION

Accordingly, it is an object of the present invention to provide a holding apparatus for use in a cleaner or dryer for dual pin type electronic parts, which apparatus can clean and/or dry automatically the electronic parts in line after the solder dipping.

The holding apparatus of the present invention includes a central shaft mounted in a housing which has an opening at the top, a pair of end plates provided on both ends of the central shaft, at least one rail rod connected between the end plates in parallel relation to the central shaft, a mounting table attached on each rail rod for mounting dual pin type electronic parts thereon, and a holding rod mounted at the side of each rail rod for holding the electronic parts on the mounting table. Each holding rod holds the dual pin type electronic parts on each mounting table in relation to an opening and closing mechanism of a clamping apparatus provided at the upper portions of both of the cleaner and dryer to prevent the electronic parts on the mounting table from dropping off during rotation of the mounting table in order to make it possible to clean or dry the electronic parts automatically. Each holding rod opens and releases the electronic parts after the cleaning or drying is over so as to clamp them automatically by the opening and closing mechanism of the clamping apparatus and feed them to the next station.

BRIEF DESCRIPTION OF THE DRAWINGS

The above and other objects and features of the present invention will become more apparent when referring to the following descriptions in conjunction with the accompanying drawings, wherein like reference numerals denote like elements and in which.

DETAILED DESCRIPTION OF THE PREFERRED EMBODIMENT

Figure 1:
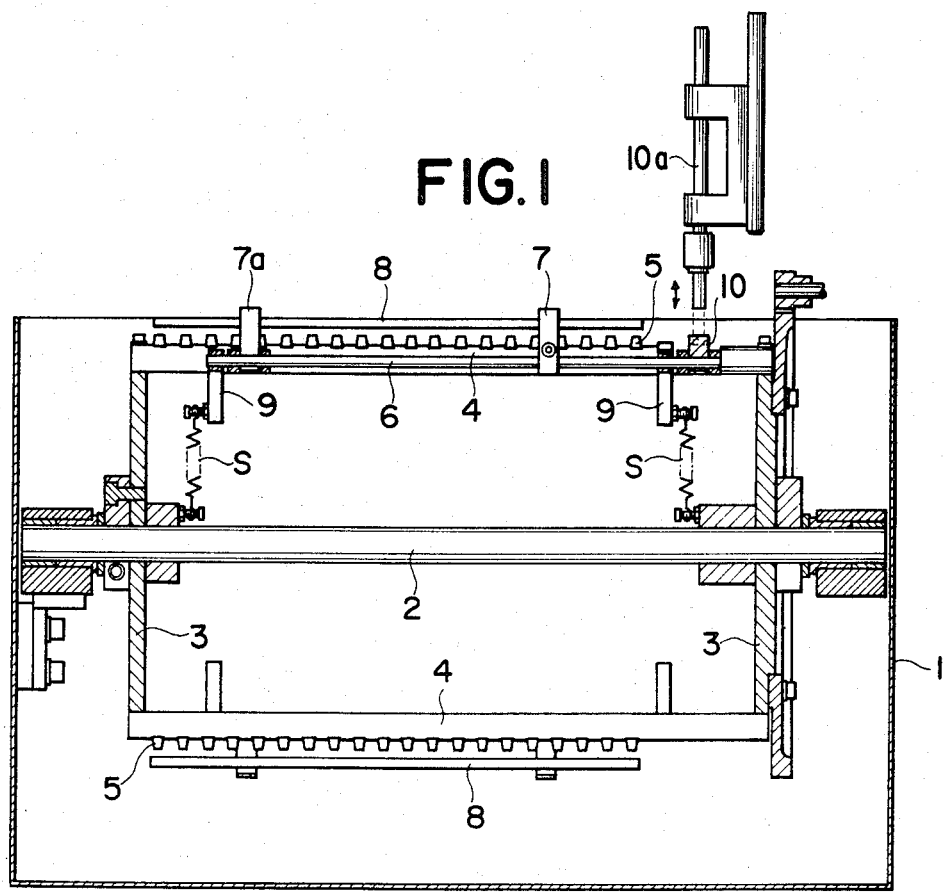
FIG. 1 is an axial sectional view showing the holding apparatus for use in a cleaner or dryer for dual pin type electronic parts according to one embodiment of the present invention.

Referring now to the drawings, especially FIG. 1, there is shown one embodiment of the holding apparatus of the present invention, in which a main shaft 2 is supported rotatably by a pair of bearings fixed to each inner wall of an outer frame 1 of a tank. To the both ends of the main shaft 2, each one of circular end plates 3 is attached. Between the outer peripheries of the end plates 3, there are provided a plurality of rail rods 4 at a predetermined pitch around the outer circumference of the end plates 3. On the outer surface of each rail rod 4, a mounting table 5 for mounting the dual pin type electronic parts thereon is attached. The mounting table 5 is comprised of a shaped steel member, for example, a shaped steel member having a substantially H-shaped seating surface in plan view.

Figure 7:
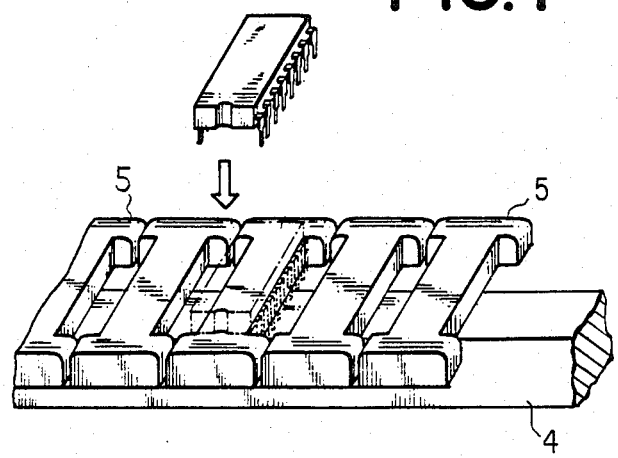
FIG. 7 is a perspective view of a dual pin type electronic part positioned on a mounting table of the instant invention.

The H-shaped seating surface is shown in FIG. 7. Because of this H-shape, the DIP type IC can ride on the seating surface of the mounting table 5 like a saddle as shown in the phantom line in FIG. 7. This H shape is used for holding the DIP type IC in a stable condition without dropping off, because the DIP type IC rides on the central or saddle portion of the table 5 and is prevented from dropping off of table 5 by the wing or stopper portions on both ends of table 5.

Figure 2:
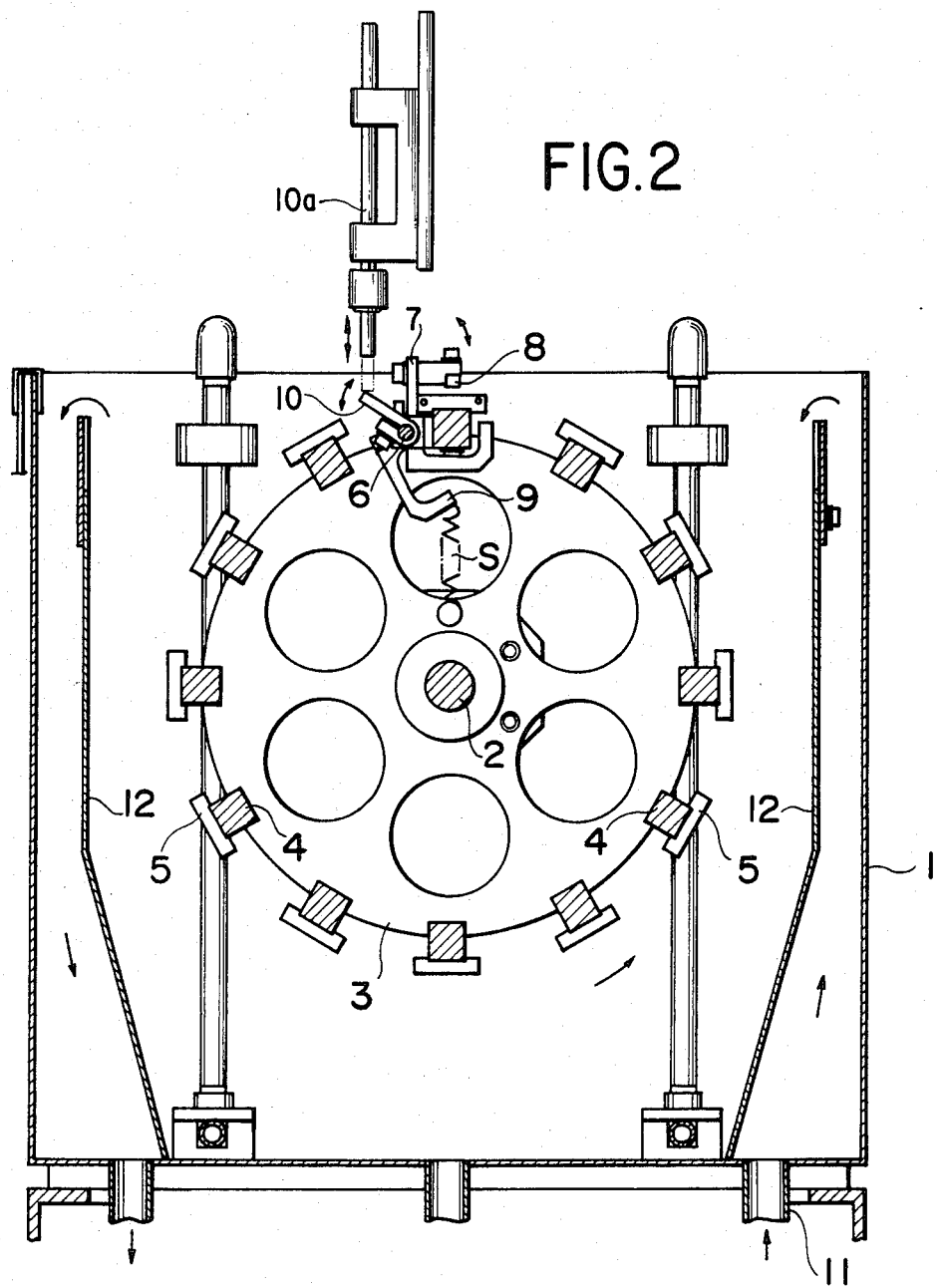
FIG. 2 is a side sectional view of a cleaner, in which the holding apparatus is incorporated.
Figure 3:
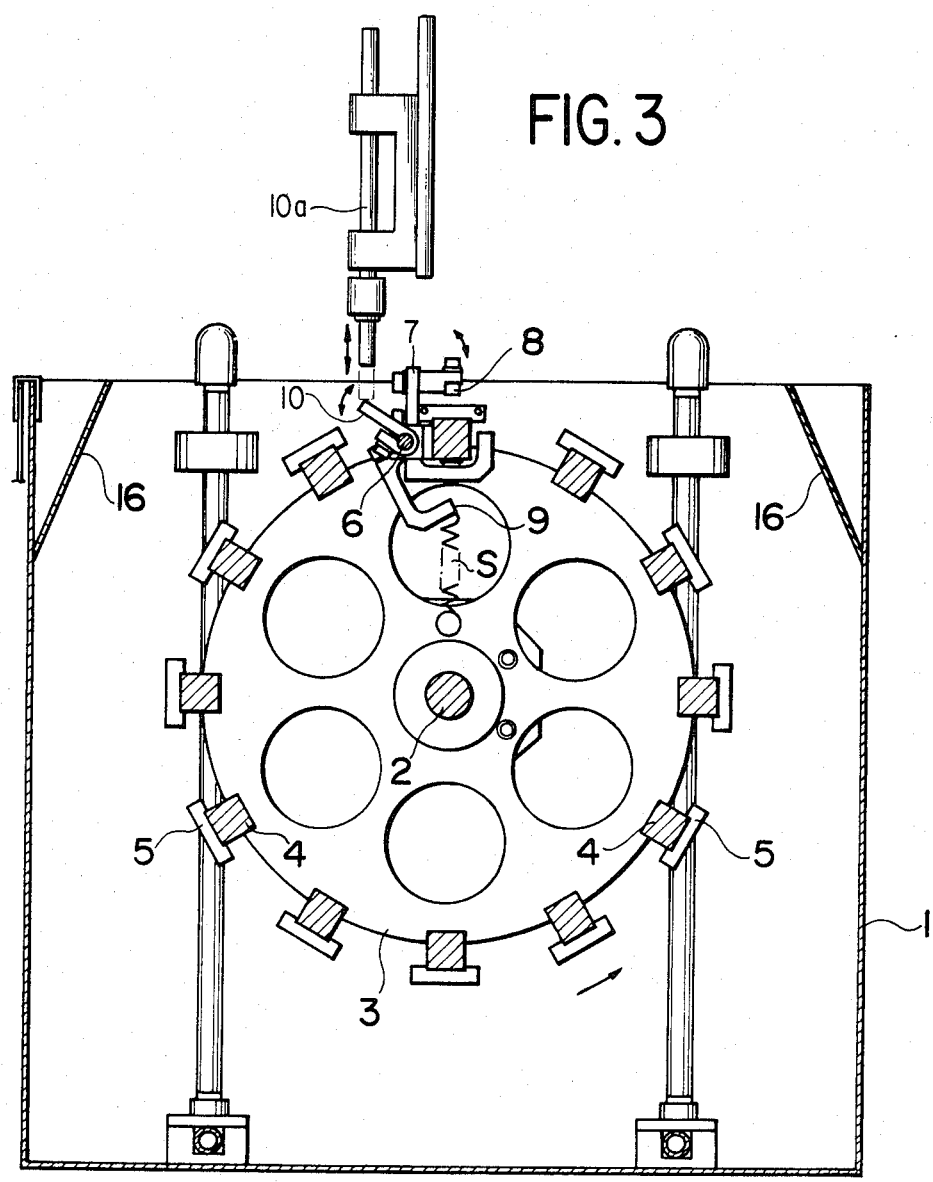
FIG. 3 is a side sectional view of a dryer, in which the holding apparatus is incorporated.

The elevating rod 10a is shown on FIGS. 1, 2, and 3. When the elevating rod 10a is pushed downwardly by a cylinder, the lower end of the elevating rod 10a abuts on the opening lever 10 and pushes down the end of the lever 10 to rotate the shaft 6. By this rotation of shaft 6, the holding rod 8 is moved in an arcuate path to release the DIP type IC as shown in arcuate arrows in FIGS. 2 and 3.

While the IC is held by the rod 8, there is a gap between the IC and the rod 8 or table 5 according to the rotational position of the main shaft 2. When the IC is held in the upper side of the tank, the IC rides on the seating surface of the saddle 5 and a gap or space is formed between the IC and the rod 8. On the contrary, when the IC is held in the lower side of the tank, the IC is seated on the rod 8 to form a gap between the IC and the saddle 5. By providing this gap, all surfaces of the IC are cleaned and dried throughly.

A shaft 6 is supported by bearings arranged along the side of the rail rod 4. Arms 7, 7a are fixed to the shaft 6 to extend outwardly in normal direction to the latter.

To the arms 7, 7a, a holding rod 8 for holding the dual pin type electronic parts on the outer surface of the mounting table 5 is attached at the position where the holding rod 8 can face to the outer surface of the mounting table 5 according to the rotational positions of the main shaft 2 and shaft 6.

A pair of clamp levers 9 are fixed to each end of the shaft 6 in the direction in which the holding rod 8 is pushed towards the outer surface of the mounting table 5, and in the position to which the shaft 6 can rotate. The free end of each lever 9 and the main shaft 2 or the end plate 3 are connected with each other in tension by spring S.

Further, at one end of the shaft 6, an opening lever 10 is attached to the shaft 6. The lever 10 extends outwardly from shaft 6 for opening or releasing the holding rod 8 and is positioned such that the shaft 6 can be rotated. The shaft 6 is rotated by pushing lever 10.

In this embodiment, the lever 10 is positioned in the reverse position against the holding rod 8 provided at the rail rod 4 side of the shaft 6, and an elevating rod 10a for pushing the lever 10 downwardly is mounted and set at the upper position of the lever 10 by a cylinder etc. In another arrangement, the holding rod 8 may be moved to hold or release the dual pin type electronic parts by engaging the lever 10 against a stopper (not shown) in correspondence with the rotational position of the main shaft 2.

In the case of a cleaner tank, as shown in FIG. 2, one or more pipes 11 for feeding cleaning water is connected to the bottom wall of the cleaner tank. At both sides along the longitudinal direction of the cleaner tank, there are provided inner walls 12 which are lower than the outer frame 1. These inner walls 12 are used for overflowing the cleaning water. For example, by using the inner walls 12, the cleaning water may be circulated successively in one tank or between a plurality of tanks when the lead pins of dual pin type electronic parts are cleaned after the solder dipping thereto.

Figure 4:
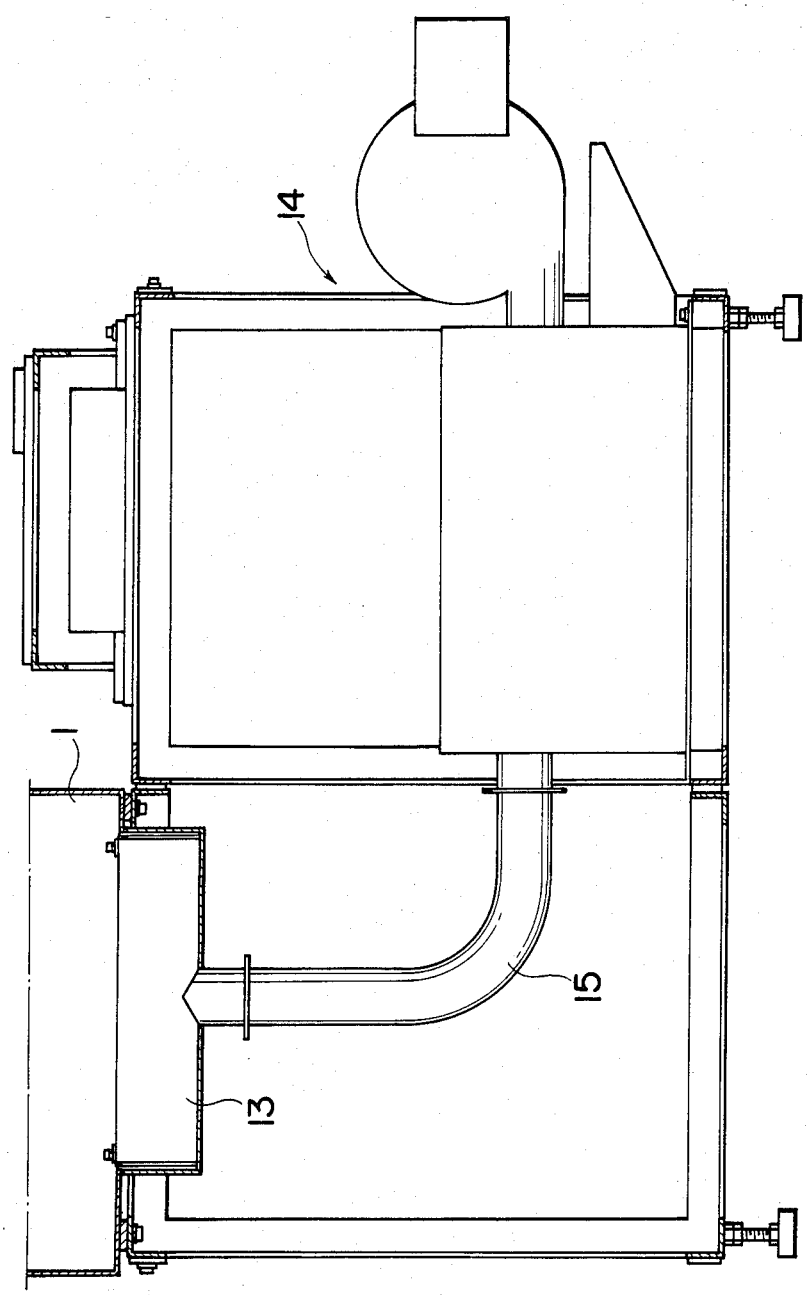
FIG. 4 is a schematic sectional view of the hot air generating mechanism.

On the other hand, in case of a dryer tank, as shown in FIG. 3, heat retaining walls 16 are provided at a slanted angle to both inner surfaces of the outer frame 1 of the tank. Further, as shown in FIG. 4, a hot air pipe 13 is connected to the bottom of the dryer tank in order to introduce hot air from a hot air generator 14 provided at the separate position, via a flexible hose 15.

As for feeding means for feeding the dual pin type electronic parts from the cleaner station to the dryer station, and between these stations and the former or next stations, one or more clamping apparatus which can clamp the dual pin type electronic parts in line may be used. This clamping apparatus may be mounted to attachment means at the upper positions of the cleaner and dryer stations.

Figure 5:
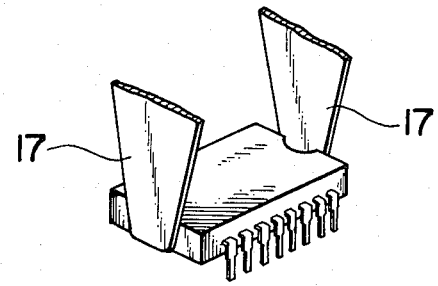
FIG. 5 is a descriptive view showing one example of dual pin type electronic parts in the condition clamped by chuck members of a clamping apparatus.

Namely, as shown in FIG. 5, chuck members 17 of the clamping apparatus provided at the upper positions of the cleaner and dryer stations according to the present invention clamp both ends of the dual pin type electronic parts after the solder dipping in line, and, at first, mount the dual pin type electronic parts on the mounting table 5 provided on the rail rod 4 of the cleaner tank shown in FIG. 1. In the cleaner tank, the electronic parts are held by the holding rod 8 and are cleaned by rotating the main shaft etc. in the water in the tank.

And then, the electronic parts which have been cleaned are released by opening the holding rod 8 so as to be clamped by the clamping apparatus and fed to the drying station.

Next, an example to which the apparatus of the present invention is applied is described hereinafter.

Figure 6:
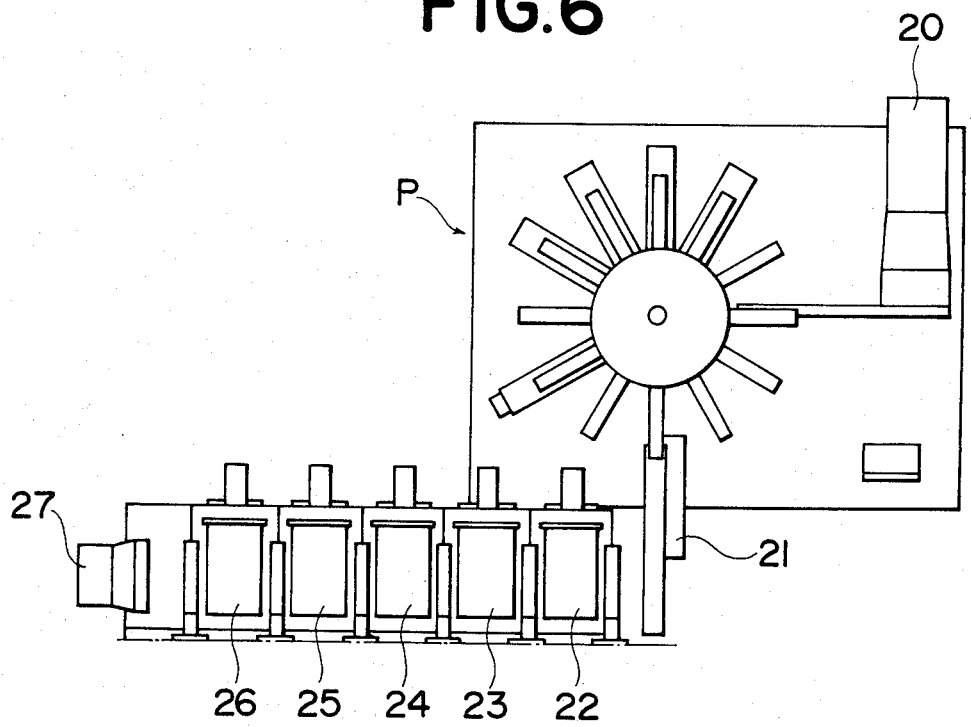
FIG. 6 is a diagrammatic plan view showing one example of a solder dipping system for dual pin type electronic parts, in which the holding apparatus of the present invention may be incorporated.

FIG. 6 is a schematic view of an automatic solder dipping system for dual pin type electronic parts. In this system, the dual pin type electronic parts fed from a feeder station 20 are transported to a discharge station 21 via a solder dipping station P which is comprised of an etching tank, a cleaner tank, a flux dipping tank, a solder dipping tank etc. arranged in a concentric circle. Then, the electronic parts are clamped by the clamping apparatus and are mounted and held on the mounting table of a first cleaner tank 22 in order to be cleaned in the tank. Next, the electronic parts are cleaned in a second cleaner tank 23 and a third cleaner tank 24 and fed to a first dryer tank 25.

The dual pin type electronic parts fed to the first dryer tank 25 are dried in the tank and then, after being dried in a second dryer tank 26, are collected in a tray 27 in line.

By the construction as stated above, the holding apparatus for use in a cleaner or dryer for dual pin type electronic parts according to the present invention can obtain many excellent effects such as those described in the following.

(1). It is possible to hold a plurality of dual pin type electronic parts in line.

(2). The dual pin type electronic parts can be cleaned or dried by holding them in line without being dropped into the tank while the rail rods and mounting tables are rotated around the main shaft in the tank.

(3). By providing the mounting table, the mounting and holding of the dual pin type electronic parts can be made with high reliability and certainty, and the lead pins of the electronic parts are prevented from being damaged.

(4). Because the gripping of the electronic parts occurs by clamping on the package surfaces of the dual pin type electronic parts, it is possible to handle them without damage. The package surfaces include the top and bottom surfaces as well as the end surfaces of the electronic parts.

(5). In the case, for example, in which the mounting tables have substantially H shapes, it is possible to hold the dual pin type electronic parts more stable while they are rotated or treated by cleaning water etc.

While some preferred embodiments of the present invention are described herein in detail, it is to be understood that the present invention is not limited thereby and many other modifications can be made within the spirit and scope of the attached claims.

What is claimed is:

1. A holding apparatus for use in a cleaner or dryer for dual pin type electronic parts, comprising a central shaft mounted in a housing which has an opening at the top, a pair of end plates provided on both ends of said central shaft, at least one rail rod connected between said end plates, a mounting table attached on each of said rail rod for mounting dual pin type electronic parts thereon, and a holding rod mounted at the side of each rail rod for holding the electronic parts on said mounting table and connected to a shaft correlated to a rotating means, said dual pin type electronic parts being loosely held between the mounting table and the holding rod such that a gap is formed between the electronic parts and the mounting table or holding rod due to rotation.

2. The holding apparatus according to claim 1, wherein said holding rod is connected to said shaft so that said holding rod holds or releases the electronic parts by operation of an opening lever fixed to said shaft.

3. The holding apparatus according to claim 2, wherein said holding rod is mounted to an arm connected to said shaft, at a predetermined angle with each other, and said arm has a predetermined angle relative to said opening lever.

4. The holding apparatus according to claim 1, wherein the electronic parts mounting surface of said mounting table has a substantially H shaped plan.

* * * * *